United States Patent
Zhang et al.

(10) Patent No.: US 8,972,213 B2
(45) Date of Patent: Mar. 3, 2015

(54) PATTERN RECOGNITION APPROACH TO BATTERY DIAGNOSIS AND PROGNOSIS

(75) Inventors: Xiaodong Zhang, Mason, OH (US); Yilu Zhang, Northville, MI (US); Yuen-Kwok Chin, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 1855 days.

(21) Appl. No.: 12/147,556

(22) Filed: Jun. 27, 2008

(65) Prior Publication Data

US 2009/0326841 A1 Dec. 31, 2009

(51) Int. Cl.
| | |
|---|---|
| G01R 19/155 | (2006.01) |
| G01R 19/15 | (2006.01) |
| G01R 19/30 | (2006.01) |
| G01R 19/32 | (2006.01) |
| G01R 31/36 | (2006.01) |

(52) U.S. Cl.
CPC ........ G01R 31/3679 (2013.01); G01R 31/3651 (2013.01)
USPC .................... 702/63; 702/58; 702/64; 702/65

(58) Field of Classification Search
USPC ........... 702/30, 57, 58, 63–65, 140, 179, 183, 702/185; 318/139; 320/132; 324/427, 433
See application file for complete search history.

(56) References Cited

U.S. PATENT DOCUMENTS

| | | | |
|---|---|---|---|
| 4,731,601 A | 3/1988 | Nowakowski et al. | |
| 6,424,158 B2 * | 7/2002 | Klang | 324/433 |
| 6,472,875 B1 | 10/2002 | Meyer | |
| 6,778,913 B2 * | 8/2004 | Tinnemeyer | 702/30 |
| 6,909,287 B2 * | 6/2005 | Bertness | 324/427 |
| 7,218,118 B1 | 5/2007 | Gonring | |
| 7,330,105 B2 * | 2/2008 | Chew et al. | 340/455 |
| 7,545,109 B2 * | 6/2009 | Salman et al. | 318/139 |
| 7,554,296 B2 * | 6/2009 | Mizuno et al. | 320/132 |
| 7,612,532 B2 * | 11/2009 | Verbrugge | 320/132 |
| 2002/0153864 A1 | 10/2002 | Bertness | |
| 2003/0184307 A1 * | 10/2003 | Kozlowski et al. | 324/427 |
| 2007/0090844 A1 | 4/2007 | Klang | |

OTHER PUBLICATIONS

Journal of Power Sources, Impedance Measurements on Lead-Acid Batteries for State-of-Charge, State-of-Health and Cranking Capability Prognosis in Electric and Hybrid Electric Vehicles, Holger Blanke, et al, pp. 418-425, 2004.

* cited by examiner

*Primary Examiner* — Eliseo Ramos Feliciano
*Assistant Examiner* — Felix Suarez

(57) ABSTRACT

A method is provided for determining a state-of-health of a battery in a vehicle-during an engine cranking phase. An engine cranking phase is initiated. Characteristic data is recorded that includes battery voltage data and engine cranking speed data during the engine cranking phase. The characteristic data is provided to a pre-processing unit. The pre-processing unit normalizes the characteristic data for processing within a classifier. The normalized data is input o the classifier for determining the vehicle battery state-of-health. The classifier has a trained state-of-health decision boundary resulting from a plurality of trials in which predetermined characterization data is collected with known classes. The battery state-of-health is classified based on the trained state-of-health decision boundary.

19 Claims, 5 Drawing Sheets

PATTERN RECOGNITION APPROACH TO BATTERY DIAGNOSIS AND PROGNOSIS

BACKGROUND OF INVENTION

The present invention relates generally to a pattern recognition method and system for determining a state-of-health (SOH) of a battery.

A vehicle's electrical power supply system must support a plurality of vehicle functions that operate on electrical energy. Such functions include normal vehicle operation devices and safety related devices such as rear window defogger, anti-lock braking/stability systems, lighting systems, etc. Additionally, the vehicle's electrical power supply system supports comfort, convenience, and entertainment devices. Some examples include air conditioning, heated seats, video/audio systems, and accessory outlet convenience devices. Moreover, with the advent of new X-by-wire technologies (e.g., steer-by-wire, brake-by-wire, etc.), even more electrical power is being demanded of the vehicle's electrical power system.

The increasing use of electrical devices as described above directly affects the drain on the vehicle battery, and more so the battery's state-of-health since acceleration of battery aging has a direct correlation with the frequency of use of such devices, which use the vehicle battery as their power source.

Therefore, on-board battery status systems attempt to determine when a battery may fail. On-board vehicle state-of-health information is typically derived based on a deterministic mathematical model; however, in many applications, it is very difficult to obtain such an accurate physics-based system model.

SUMMARY OF INVENTION

An advantage of an embodiment is the elimination of the use of a complex physics based mathematical models by using a pattern recognition system and method for determining the state-of-health of a vehicle battery based on history and statistical data collected from testing samples.

An embodiment contemplates a method for determining a state-of-health of a battery in a vehicle-during an engine cranking phase. An engine cranking phase is initiated. Characteristic data is recorded that includes battery voltage data and engine cranking speed data during the engine cranking phase. The characteristic data is provided to a pre-processing unit. The pre-processing unit normalizes the characteristic data for processing within a classifier. The normalized data is input to the classifier for determining the vehicle battery state-of-health. The classifier has a trained state-of-health decision boundary resulting from a plurality of trials in which predetermined characterization data is collected with known classes. The battery state-of-health is classified based on the trained state-of-health decision boundary.

An embodiment contemplates a battery state-of-health monitoring that includes a preprocessing unit that is adapted to be coupled to sensed signals for obtaining characteristic data including battery voltage data and engine cranking speed data during an engine cranking phase for a starting of a vehicle. A classifier has a trained state-of-health decision boundary resulting from a plurality of trials in which predetermined characterization data is collected with known classes. The classifier further includes a processor for comparing the characterization data and the trained state-of-health decision boundary to produce a state-of-health class indicating the degree of similarity with the known classes.

DETAILED DESCRIPTION

Figure 1:
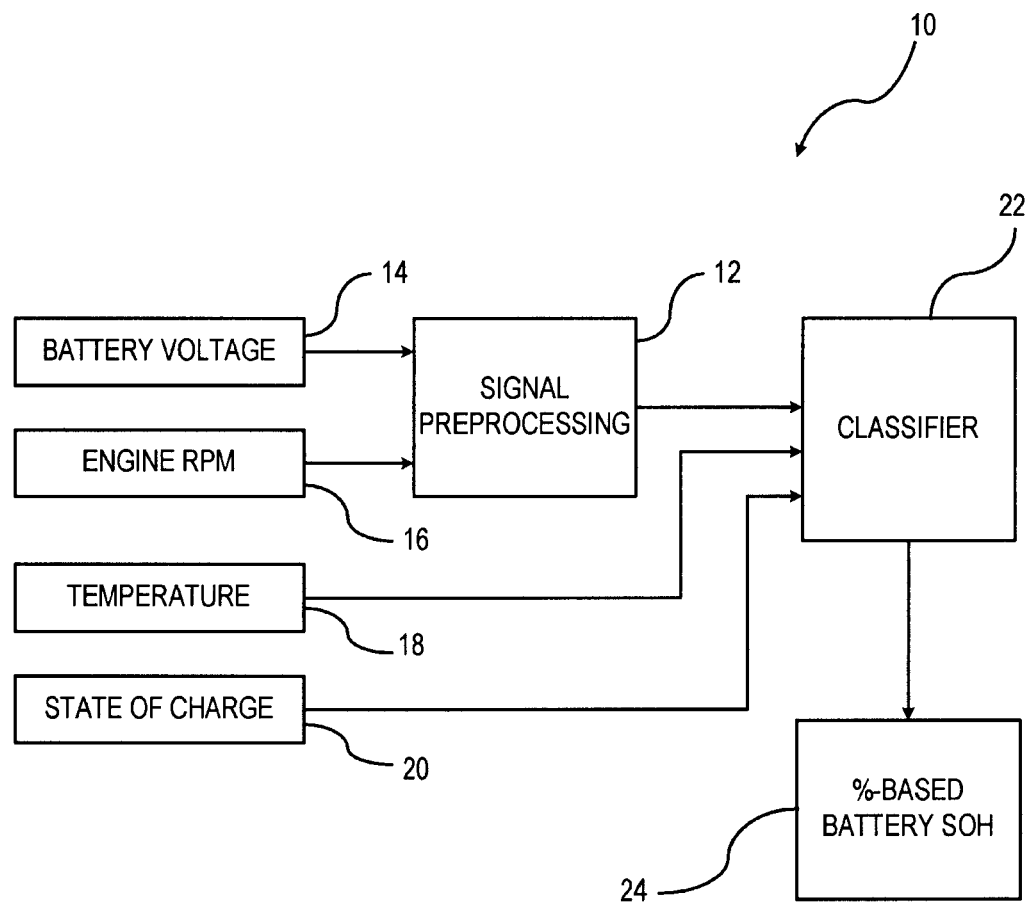
FIG. 1 is a block diagram of a battery SOH monitoring system according to an embodiment.

FIG. 1 illustrates a battery state-of-health monitoring system 10 for monitoring a battery in a vehicle. The SOH monitoring system 10 includes a pre-processing unit 12 for receiving input signals relating to engine starting characteristics for determining the SOH of a vehicle battery. Primary characteristics provided to the pre-processing unit 12 include battery voltage data 14 and engine rpm data 16. Other primary signals may include, but are note limited to, battery current. The primary characteristic data is normalized as it is processed within the pre-processing unit 12. Additional data processing may be performed in the pre-processing unit 12 in addition to normalizing the characteristic data. Secondary characteristics that may further assist in assessing the SOH of the battery include, but are not limited to, temperature data 18 and the state-of-charge (SOC) data 20. Both the primary characteristics and the secondary characteristics are recorded during the engine cranking phase of the engine start operation. The primary and secondary characteristics are recorded over an interval from the time when the starter motor engages the engine to the time when the engine is successfully cranked, which can be determined, for example, if the engine speed reaches a predetermined rpm.

The inputs are processed and the data is provided to a classifier 22. The classifier 22 includes a trained state-of-health decision boundary, or the like, for classifying the current SOH of the vehicle battery during the engine cranking phase. The primary and secondary characteristic data input to classifier 22 is compared to the trained state-of-health decision boundary for classifying the SOH of the battery. The classifier 22 outputs the SOH status 24 for indicating the current SOH level of the vehicle battery. The SOH status 24 may be provided as an indicator for identifying the current condition of the vehicle battery. For example, the indicator may be a warning indicator that includes a visual, audible, or tactile indicator which identifies a percentage based SOH level of the vehicle battery or may be any other type of warning indicator indicating that the battery is at a non-acceptable SOH level.

The state-of-health classifier is initially trained by a training program. Once the training within the training program is complete, a classifier is obtained. It should be understood that the classifier includes, but is not limited to, classifiers that are based in a vehicle and classifiers that are remote from a vehicle that communicate with the vehicle such as respective systems that transmit the data to a remote monitoring center for processing and classification. The classifier is preferably a two-class classifier that is trained by the training program using recorded trial data obtained from a plurality of batteries with known SOH classes. A first class is associated with respective batteries having acceptable SOH level (e.g., good SOH level) for starting a vehicle. A second class is associated with respective batteries having an unacceptable SOH level for starting a vehicle. Alternatively, the classifier may be trained to utilize more than two classifications.

The classifier may be any classifier that can be trained to distinguish between the SOH classes. Examples may include, but are not limited to, a neural network classifier and support vector machines. The training program generates the SOH decision boundary based on the input data received for distinguishing the characteristic data between different classes. For example, a support vector machine maps input data to a higher dimensional space where a maximal separating hyperplane is constructed. The support vector machine constructs two parallel hyperplanes. The two parallel hyperplanes are constructed on each side of the separating hyperplane for separating the data. The separating hyperplane maximizes the distance between the two parallel hyperplanes. The basic concept is that the larger the distance between the two parallel hyperplanes, the lower the misclassification rate will be when classifying the data to a respective class.

Figure 2:
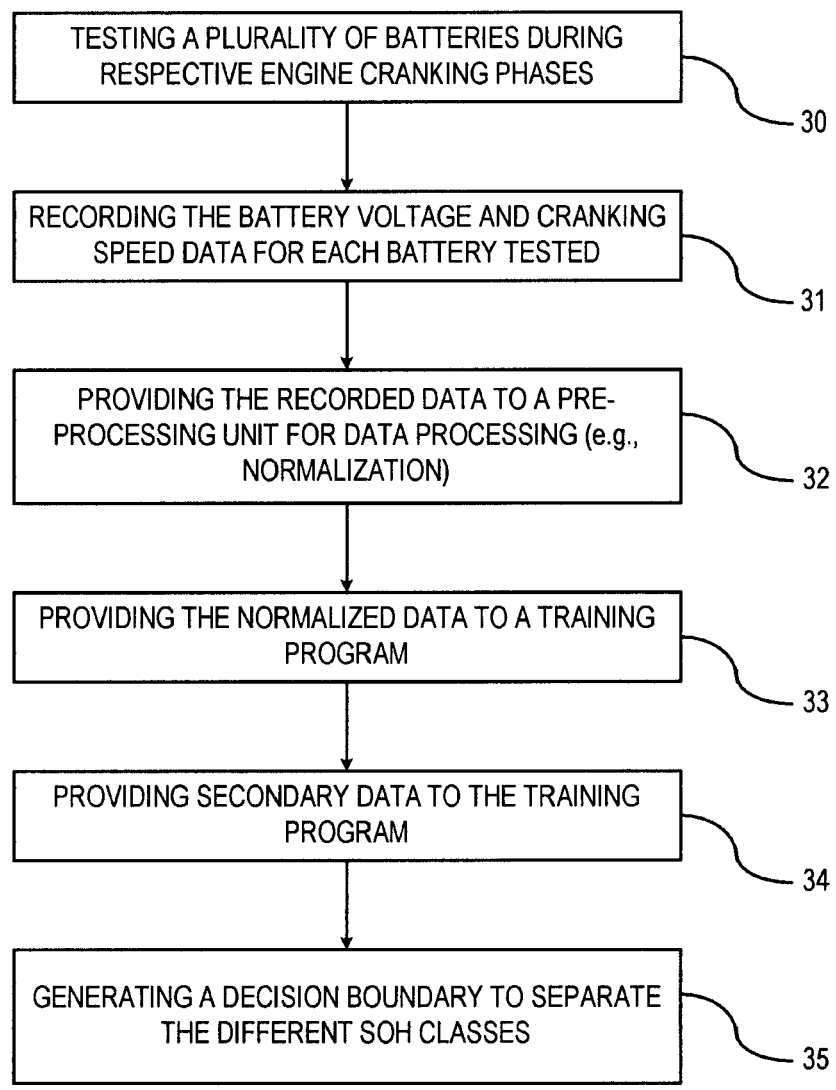
FIG. 2 is a flowchart of a method for training a classifier according to an embodiment.

FIG. 2 illustrates a flowchart for a method for training a respective classifier. In step 30, a plurality of batteries having known SOH properties are provided. The batteries are each coupled to a vehicle engine starting system, or similar set-up, for starting a vehicle engine of the type into which the final monitoring system will be used.

Figure 4:
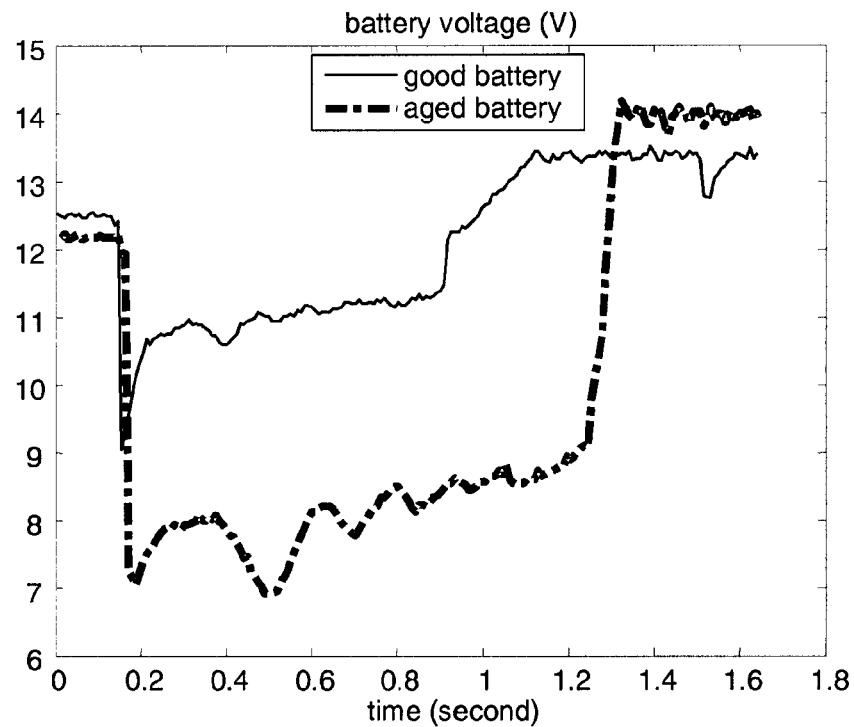
FIG. 4 is a graph of battery voltage data recorded during an engine cranking phase according to an embodiment.
Figure 5:
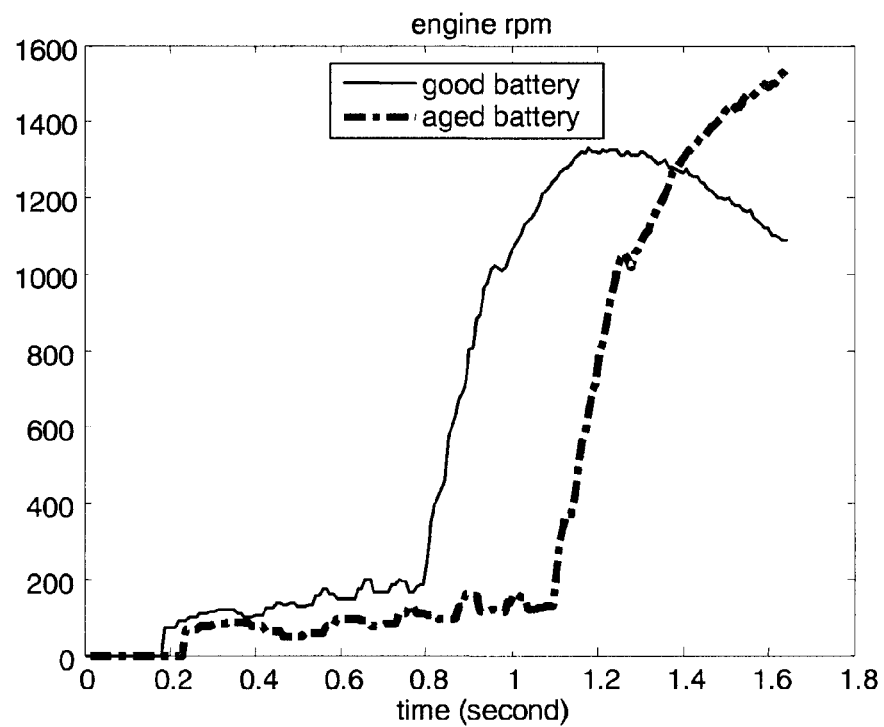
FIG. 5 is a graph of engine rpm data recorded during an engine cranking phase according to an embodiment.

In step 31, the battery voltage and engine cranking speed data are monitored and recorded from each of the plurality of batteries tested during each engine cranking phase, specifically, the interval between the moment the battery voltage drops due to starter motor engagement and the time cranking is successfully cranked (for instance, the engine speed reaches a predetermined engine rpm). Examples of recorded battery voltage data and engine rpm data for an acceptable battery and a non-acceptable battery are shown as examples in FIGS. 4 and 5, respectively. Other related characteristic signals may also be used, which includes but is not limited to, battery current. In step 32, the recorded data is provided to a pre-processing unit. The pre-processing unit performs processing of the recorded data to facilitate classification, which includes, but is not limited to, normalizing the input data. A maximum and a minimum of each input data signal are saved.

In step 33, the normalized data from the pre-processing unit is inputted to a training program. In step 34, secondary battery characteristic data is provided to the training program. Secondary battery characteristic data includes, but is not limited to, temperature data and SOC data.

Figure 6:
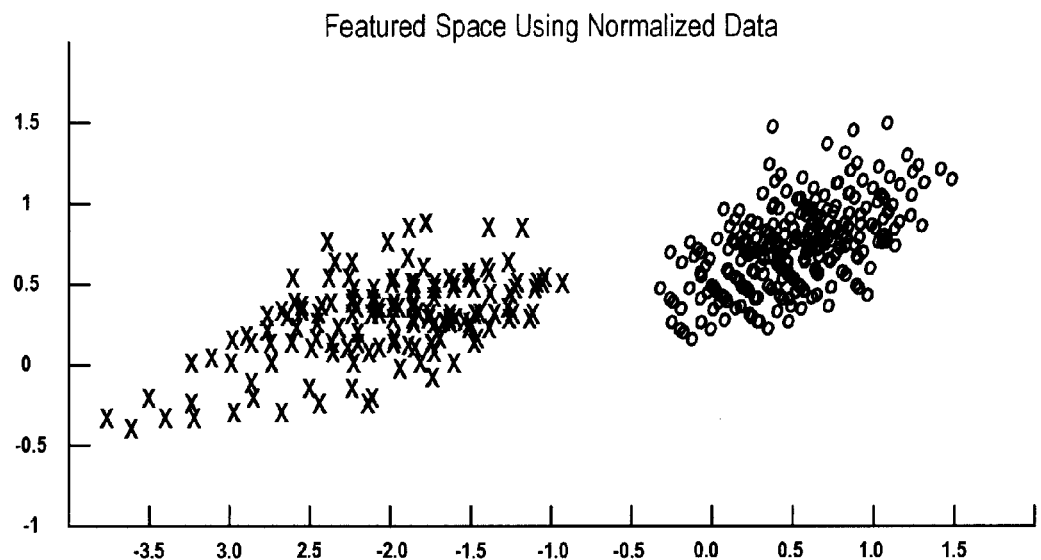
FIG. 6 is a plot of the normalized data in feature space according to an embodiment.

In step 35, the training program learns the decision boundary between different classes based on the normalized data received from the pre-processing unit and secondary characteristic data. As stated earlier, the first class relates to vehicle batteries having an acceptable SOH level for starting the vehicle, and the second class relates to vehicle batteries having non-acceptable SOH levels for starting the vehicle. FIG. 6 illustrates a plot of the normalized data in feature space for the respective batteries having acceptable SOH levels (represented by the symbol "o") and respective batteries having non-acceptable SOH levels (represented by the symbol "x") in feature space. A state-of-health decision boundary is generated for implementation within a classifier for evaluating a battery SOH during each engine cranking phase.

The state-of-health decision boundary may be implemented as a pattern recognizer, look-up table, or the like within the classifier for evaluating the state-of-health of the vehicle battery. An embodiment for implementing the state-of-health classifier is to evaluate the SOH of the vehicle battery during an engine cranking process. The classifier provides a probability estimate of the testing data associated with each class, which can be utilized to provide percentage level based battery SOH prognosis. More specifically, the probability associated with the first class corresponding to vehicle batteries having acceptable SOH levels provides an estimate of the percentage based battery SOH. For example, assume that n samples have been collected during a single engine cranking phase. For each sample i, i=1, . . . , n, the classifier will generate a probability $p_i$ associated with the first class of the classifier. To improve the estimation accuracy, the percentage-based battery SOH is obtained by employing low-pass filtering techniques, e.g., average the probabilities by using the following formula:

$$\frac{1}{n}\sum_{i=1}^{n} P_i$$

Figure 3:
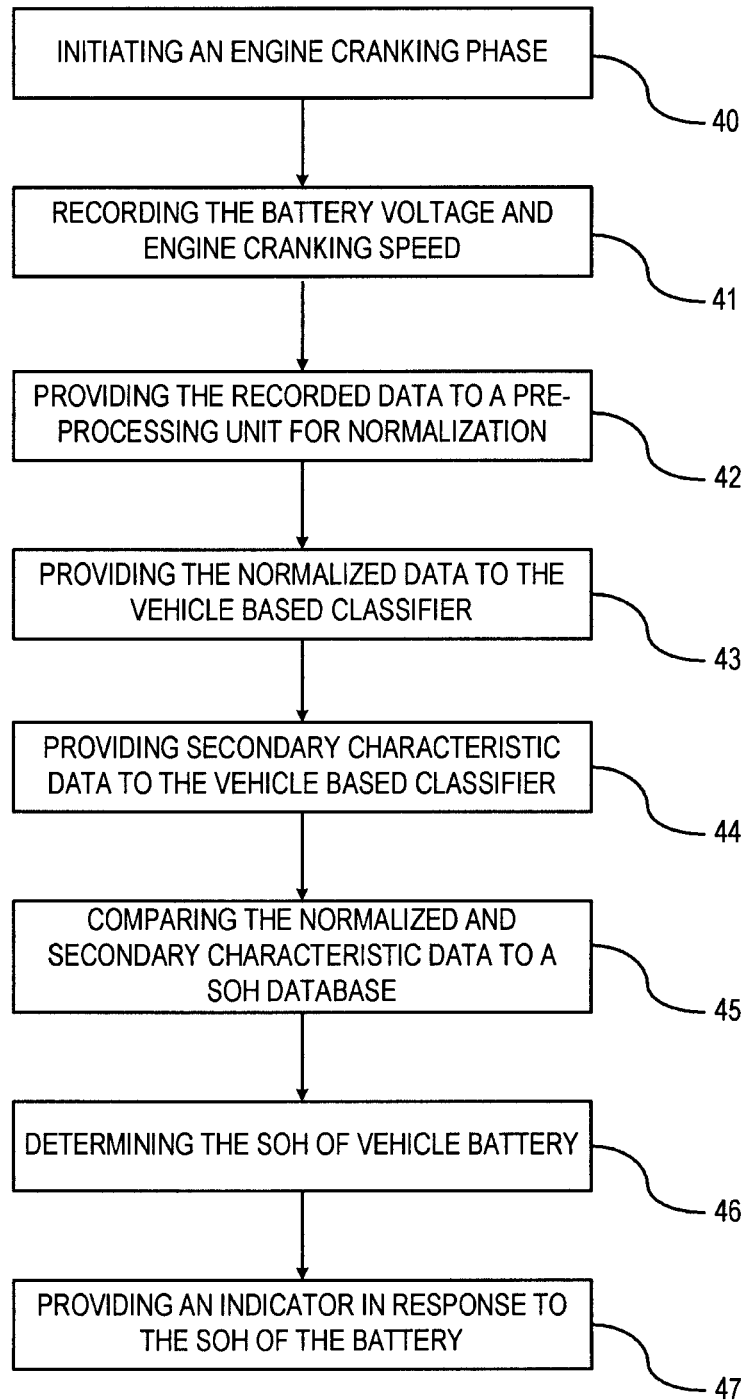
FIG. 3 is a flowchart of a method for determining a SOH of a vehicle battery according to an embodiment.

FIG. 3 illustrates a flowchart for determining the SOH of a battery in a vehicle using a trained classifier. In step 40, a cranking phase of an engine start operation is initiated. In step 41, the battery voltage and engine cranking speed is recorded during the engine cranking phase. Preferably the data recorded in step 41 is recorded during the interval when the battery voltage drops due to a starter motor engagement and the time when engine is successfully cranked (e.g., the engine speed reaches a predetermined engine rpm).

In step 42, the recording battery voltage and engine cranking speed data are provided to the pre-processing unit for normalization.

In step 43, the normalized data is provided to the classifier for determining the SOH classification. The classifier includes at least two classes with the first class representing characteristic data associated with an acceptable battery SOH level for engine starting and the second class representing an unacceptable battery SOH level for engine starting.

In step 44, secondary characteristic data, including but not limited to, temperature data and state-of-charge data is provided to the classifier for determining the SOH condition of the vehicle battery based on the received inputs.

In step 45, the classifier compares the normalized data received from the pre-processing unit to the state-of-health decision boundary for determining the SOH class of the normalized data.

In step 46, the SOH status level of vehicle battery as determined by classifier is generated. In step 47, a warning indicator is actuated in response to a determination that the SOH of the vehicle battery is below an acceptable level.

Figure 7:
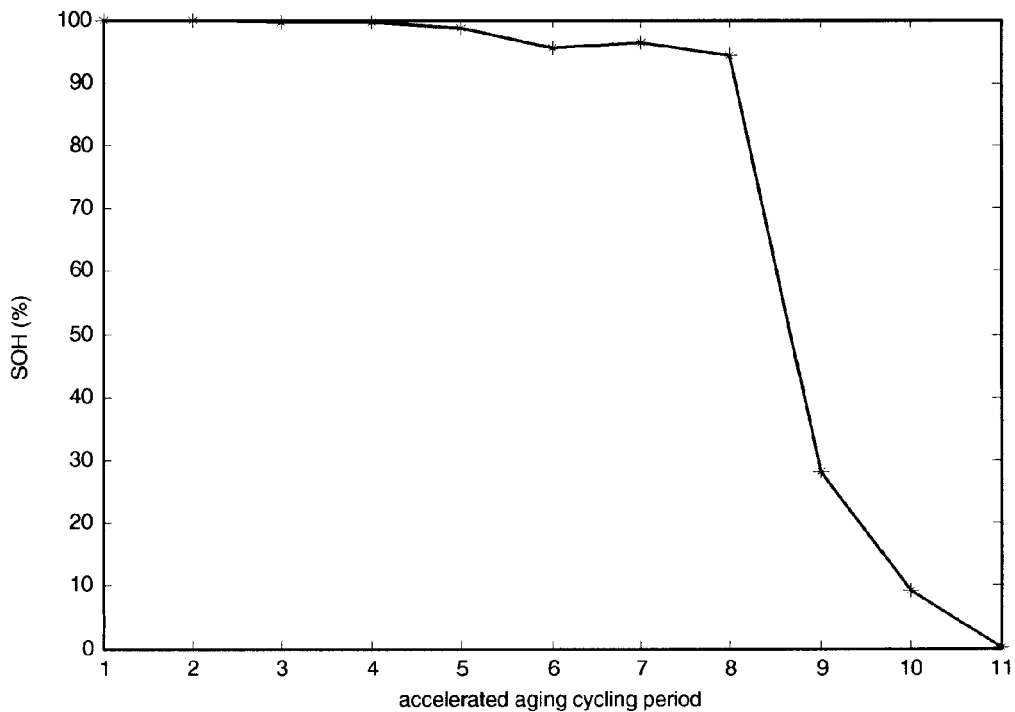
FIG. 7 is a plot of estimated battery SOH illustrating SOH degradation over time according to an embodiment.

FIG. 7 is a plot of estimated battery SOH illustrating the SOH degradation. A battery was aged from fresh to end-of-life through accelerated aging cycling. Vehicle cranking data was periodically collected during the aging process and used to test the SOH monitoring method. A two-class support vector machine classifier was trained using the cranking data, and the estimated percentage-based battery SOH is in shown in the figure, which illustrates the degradation of battery SOH from 100% to 0%.

While certain embodiments of the present invention have been described in detail, those familiar with the art to which this invention relates will recognize various alternative designs and embodiments for practicing the invention as defined by the following claims.

What is claimed is:

1. A method for determining a state-of-health of a battery during an engine cranking phase, the method comprising the steps of:
   initiating the engine cranking phase;
   recording characteristic data including battery voltage data and engine cranking speed data during the engine cranking phase;
   providing characteristic data to a pre-processing unit, the pre-processing unit normalizing the characteristic data for processing within a classifier;
   inputting the normalized data to the classifier for determining the battery state-of-health, the classifier having a trained state-of-health decision boundary resulting from a plurality of trials in which predetermined characterization data is collected with known classes; and
   classifying the battery state-of-health based on the trained state-of-health decision boundary.

2. A method of claim 1, wherein the trained state-of-health decision boundary is generated by the process comprising:
   monitoring a plurality of batteries having known classes during respective engine cranking phases;
   recording a battery voltage and engine cranking speed data for each monitored battery during the respective engine cranking phases;
   normalizing the recorded battery voltage and engine cranking speed data of each monitored battery;
   inputting the normalized data for each monitored battery into a training program, the training program learning a decision boundary in response to the normalized data of each monitored battery provided to the training program for establishing the classifier to distinguish each respective class; and
   generating the trained state-of-health decision boundary in response to the normalized data of each monitored battery classified in the training program, the state-of-health decision boundary being configured for use in the classifier for classifying the vehicle battery state-of-health to a respective class, wherein at least one of the respective classes is associated with the state-of-health of a vehicle battery being below an acceptable level.

3. The method of claim 2 wherein inputting the normalized data to the training program includes inputting the normalized data to a neural network-based training program.

4. The method of claim 2 wherein inputting the normalized data to the training program includes inputting the normalized data to a support vector-based training program.

5. The method of claim 2 wherein recording the battery voltage and engine cranking speed data of each monitored battery during each engine cranking phase is obtained during an interval between a time the battery voltage decreases due to a starter engagement and the time when an engine speed reaches a predetermined engine speed.

6. The method of claim 2 wherein temperature data and state of charge data obtained during each engine cranking phase for each monitored battery are provided to the training program.

7. The method of claim 1 wherein temperature data is provided to the classifier for determining the respective class of a respective battery.

8. The method of claim 1 wherein a state of charge data is provided to the classifier for determining the respective class of a respective battery.

9. The method of claim 1 wherein the classifier outputs a percentage based battery state-of-health.

10. The method of claim 1 wherein the characteristic data is obtained during an interval between a time the battery voltage decreases due to a starter engagement and the time when an engine speed reaches a predetermined engine speed.

11. A battery state-of-health monitoring system comprising:
    a preprocessing unit adapted to be coupled to sensed signals for obtaining characteristic data including battery voltage data and engine cranking speed data during an engine cranking phase for a starting of a vehicle; and
    a classifier having a trained state-of-health decision boundary resulting from a plurality of trials in which predetermined characterization data is collected with known classes, the classifier further having a processor for comparing the characterization data and the trained state-of-health decision boundary to produce a state-of-health class indicating the degree of similarity with the known classes.

12. The system of claim 11 wherein the trained state-of-health decision boundaries resulting from a plurality of trials is generated by an training program, the plurality of trials include monitoring a plurality of batteries and associated engine speeds during respective engine cranking phases for collecting the predetermined characteristic data, wherein the collected predetermined characteristic data is used to establish pattern recognition within each class.

13. The system of claim 12 wherein the predetermined characteristic data further includes environmental data, the environmental data being provided to the training program for generating the state-of-health decisions boundary.

14. The system of claim 13 wherein the predetermined characteristic data further includes temperature data provided to the training program.

15. The system of claim 13 wherein the predetermined characteristic data further includes state of charge data provided to the training program.

16. The system of claim 11 wherein environmental factors including temperature data are provided to the classifier for determining the class of the battery state-of-health.

17. The system of claim 11 wherein environmental factors including state of charge data are provided to the classifier for determining the class of the battery state-of-health.

18. The system of claim 11 wherein the indicator is a display identifying a percentage based state-of-health of the battery.

19. The system of claim 11 wherein the indicator is a warning identifying the state-of-health of a battery is below an acceptable level.

* * * * *